United States Patent [19]
Humphreys

[11] 3,838,442
[45] Sept. 24, 1974

[54] SEMICONDUCTOR STRUCTURE HAVING METALLIZATION INLAID IN INSULATING LAYERS AND METHOD FOR MAKING SAME

[75] Inventor: Charles B. Humphreys, Pleasant Valley, N.Y.

[73] Assignee: International Business Machines Corporation, Armonk, N.Y.

[22] Filed: June 9, 1972

[21] Appl. No.: 261,348

Related U.S. Application Data

[63] Continuation of Ser. No. 28,891, April 15, 1970, abandoned.

[52] U.S. Cl. .......................... 357/54, 357/68, 357/71
[51] Int. Cl. .......................... H01l 29/34
[58] Field of Search .......................... 317/234, 235

[56] References Cited

UNITED STATES PATENTS

| | | | |
|---|---|---|---|
| 3,461,347 | 8/1969 | Lemelson | 317/101 |
| 3,461,357 | 8/1969 | Mutter et al. | 317/234 |
| 3,479,237 | 11/1969 | Bergh et al. | 156/11 |
| 3,584,264 | 6/1971 | McLouski et al. | 317/234 |
| 3,597,834 | 8/1971 | Lathrop et al. | 29/576 |
| 3,622,384 | 11/1971 | Davey et al. | 117/212 |
| 3,649,888 | 3/1972 | Pitzer et al. | 317/235 |

OTHER PUBLICATIONS

1EEE Transactions on Elec. Devices, Oct. 1969, pp. 876–877.

IBM (TDB), Vol. 8, No. 11, April 1966, p. 1687.

*Primary Examiner*—Rudolph V. Rolinec
*Assistant Examiner*—E. Wojciechowicz
*Attorney, Agent, or Firm*—Thomas F. Galvin

[57] ABSTRACT

In a semiconductor structure with multiple levels of metallization on the surface, each metallization pattern is inlaid in trenches formed in an insulating layer. The surface of the metallization is flush with or somewhat lower than the surface of its associated insulating layer. In a preferred embodiment, the different etching characteristics of glass and silicon nitride are utilized to form the trenches in the glass layer. The glass comprises the insulating layer and the nitride forms the bottom of the trench.

5 Claims, 12 Drawing Figures

PATENTED SEP 24 1974

3,838,442

SHEET 1 OF 2

INVENTOR
CHARLES B. HUMPHREYS

BY Maurice H. Klitzman
ATTORNEY

SEMICONDUCTOR STRUCTURE HAVING METALLIZATION INLAID IN INSULATING LAYERS AND METHOD FOR MAKING SAME

This is a continuation of application Ser. No. 28,891 filed Apr. 15, 1970 and now abandoned.

BACKGROUND OF THE INVENTION

1. Field of the Invention

This invention relates to semiconductor structures wherein crossover connections between active devices within the structure, external leads and power buses are formed on the surface of the semiconductor body.

2. Description of the Prior Art

Recent technological advances have enabled transistor manufacturers to place more and more active and passive elements into the body of a semiconductor chip. For example, it is possible to form more than 500 such elements into a chip having an area of less than 100 by 100 mils. This has presented a serious problem in interconnecting the devices within the chip to form circuits and in providing external connections from the chip.

Several alternative techniques have been advanced, none of which have met with great success.

In one method, the connections are formed separately on multilayered ceramic substrates. With this method, many of the interconnections between individual devices as well as substantially all of the external connections to other sources are formed on the various layers of the laminated ceramic structure. However, this method has the basic flaw of consuming a large area as compared to the size of the semiconductor chip mounted thereon. In addition to the basic flaw, there is a problem of the length of the connection between the device within the chip and the connection on the ceramic. The longer the lead, other factors being equal, the longer it will take a signal to propagate. This has led to the rather anomalous result of having the transistor "package" cause a considerable portion of the total delay in signal propagation. Of course, as the art has advanced in forming a device within a smaller area of the semiconductor chip, this problem has grown steadily worse, relatively speaking.

A second technique which has received considerable publicity is the bonding of external connections at the periphery of the chip itself or on a ceramic substrate which holds the chip. These connections, in the form of wires of minute diameter, jump over the active areas of the chip, very similarly to conventional wiring. The problems with this technique are the fragility of the wires and the great difficulty in bonding the wires to small contact areas.

A third technique, to which the present invention is directed, is to produce most of the conductive connections in multiple levels on the surface of the chip itself. In circuits requiring relatively few interconnections between devices and few power connections, all of the metallization may be confined to one level. However, the art has progressed to having such increased density of devices per chip that more than one metallization level is required. In general, the prior art multilevel metallization technique has comprised:

(1) the deposition of ohmic contacts and certain device interconnections on a first level; (2) depositing one or more insulation layers atop the first metallization; (3) producing via holes within the insulation; (4) depositing a second pattern of metallization atop the insulation; (5) simultaneously connecting selectively the first level of metallization with the second level through the via holes; and reproducing steps 2, 3, 4, and 5 to form a third level. This technique, and the many variations of it which have been suggested in the prior art, has resulted in a commercially acceptable transistor structure. However, in production the ratio of acceptable finished circuits to the total number of circuits started initially, i.e., the yield, has remained lower than desired. The basic problem lies in the humps formed by the conductive lands at the locations where an insulation layer passes over or under the conductive lands which form the metallization pattern. These humps are present in all techniques which appear in patents and technical publications directed to insulating the multilevel metallization patterns printed on top of the chip. They are not evident in many drawings, probably for reasons of clarity and because they had not caused noticeable problems in the particular processes or structures involved. However, these humps have been found to be a principal cause of the formation of pinholes and stress cracks in the insulation layer and pinholes in the metallization. One reason for this lies in the discontinuity present in the otherwise smooth insulation layer where it passes over the conductive metallization pattern. The stress on the insulation layer is greatest at that location. In addition, there are locations in a non-planar insulation layer where its thickness is less than the average thickness. These locations will have more pinholes than average. These pinholes and stress cracks may cause one portion of a metallization pattern to "short" with another; or cause one portion of one level of metallization to short with another level. Pinholes and stress cracks in the insulation layer may also cause pinholes in the metallization. During an etching process on the metallization, the etchant may seep through the insulation and attack the metal at an undesired location, resulting in the pinhole. Pinholes in the metal may, in turn, cause pinholes in the insulation layer if an insulation etchant seeps through the metal. Any of these occurrences can cause a defective chip.

SUMMARY OF THE INVENTION

It is therefore an object of this invention to provide an improved semiconductor structure with multilevel metallization on the surface thereof and a method for making it.

A further object is to provide an improved method for eliminating humps occurring at crossover points of insulation and metallization patterns.

Another object is to substantially eliminate pinholes and stress cracks commonly occurring in semiconductor structures having multilevel metallization.

Another object is to provide a method for accurately forming trenches in an insulating layer which allows an accurate deposition of metallization in the trenches.

The preset invention accomplishes these and other objects by providing a structure in which each level of metallization is inlaid within an associated insulating layer and bottomed on a passivating layer. In each laminated section formed by the passivating and insulating layers and the metallization, the surface of the metallization is flush with or somewhat lower than the surface of the insulating layer. However, good results are obtained if the surface of the metallization lies within the range of 50A higher than the surface of the insulating layer and 2500A lower than the surface of the insulating layer. This range as defined is termed "substantially flush" in this application and the term will be understood to mean that range.

The preferred method is to etch a trench in the insulating layer and then deposit the metallization into the trench. The bottom of the trench comprises the upper surface of a passivating layer which is insensitive to the etchant used to etch the insulating layer. Preferrably, the insulating layer is glass and the passivating layer is a conjoint layer of silicon oxide and silicon nitride; the nitride is the upper portion of the conjoint layer.

IN THE DRAWING

All of the figures are not necessarily to scale. In some instances, the dimensions have been exaggerated for clarity and to show particular aspects of the invention.

Figure 1:
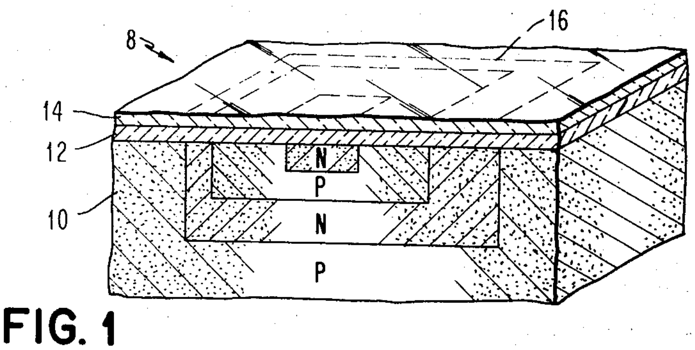
FIG. 1 is a sectional perspective view of the junctions of a single active device within a passivated planar semiconductor chip.
Figure 1A:
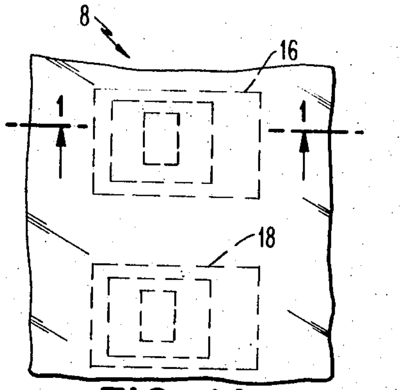
FIG. 1A is a view of the top surface of a portion of the chip showing two active device areas.

Referring now to FIG. 1 and FIG. 1A, a semiconductor chip 8 is shown having a substrate 10 which is covered by two passivating coatings 12 and 14. The chip is one section of perhaps 50 or 60 such chips which together form a semiconductor wafer. Within the substrate 10 are areas, generally denoted as 16 and 18, containing surface junctions which form active devices. The bulk of substrate 10 may comprise a monocrystalline p-type silicon semiconductor body having an oriented surface and exhibiting relatively high resistivity, e.g., in the order of 10 ohm-cm.

Typically, chip 8 is around 100 by 100 mils, and, of course, contains many active areas of which areas 16 and 18 are merely illustrative. In addition, the chip may contain regions which are passive, i.e., resistive and capacitive, which may also be connected on top of the chip in accordance with the present invention.

FIG. 1 is a sectional perspective view of area 16, taken along line 1—1 of FIG. 1A. Area 16 is totally within chip 8 except for the upper surface, which initially is completely covered by conjoint passivating coatings 12 and 14 which together form a passivating layer. For simplicity and ease of understanding, area 16 is depicted as a segment removed from chip 8. Furthermore, it will be understood that each of the processes to be performed on area 16 is also performed, preferably simultaneously, on area 18. Within area 16, there is shown a planar N-P-N junction device. The fabrication of this kind of device is well known to those skilled in the art. It will be recognized that the invention is not confined to a particular type of device or process of forming the device. For instance, the device could be a P-N-P type with an N type substrate 10. Also, germanium instead of silicon could be used as the semiconductor material. It is important only that the ohmic contacts be formed at the surface of the device, the surface being substantially planar.

Coating 12 is preferrably an oxide of silicon. Any conventional technique may be used to form the silicon oxide layer. The particular choice will depend on the nature of the semiconductor material. In the case of a silicon wafer, a silicon dioxide coating is formed preferrably as a genetic coating formed by thermal growth from the silicon body itself. One preferred technique is to heat the body to between 900° C. to 1400° C. in an oxidizing atmosphere of air saturated with water vapor or in an atmosphere of steam, thus forming a silicon dioxide coating. Alternately, an R.F. sputtering method may be used to form the silicon dioxide coating. If the semiconductor material is germanium rather than siicon, a silicon oxide coating may be formed by pyrolytic decomposition of ethyl silicate vapor. In the present embodiment, coating 12 is silicon dioxide with a depth of 600a. The thickness preferrably ranges from 2000A to 8000A. In the remainder of the specification, the term silicon oxide will be understood to also include silicon dioxide. The silicon nitride coating 14 is contiguous with silicon oxide coating 12. The silicon nitride coating may be formed by known techniques such as R.F. sputtering, as described in co-pending application Ser. No. 494,789, filed Oct. 11, 1965, or by reactive sputtering, as described in co-pending application Ser. No. 583,175, filed Sept. 30, 1966. Both of these applications are assigned to the assignee of the present invention. A third technique which could be used to form the silicon nitride coating is the pyrolytic decomposition of a gaseous mixture of silane and ammonia which is heated to around 900° C. The preferred technique is to R.F. sputter the silicon nitride coating to a thickness of around 1000A, but preferrably below 2000A.

The ranges of thickness of silicon oxide coating 12 and silicon nitride coating 14 may vary from the preferred thickness. However, in the preferred embodiment of this invention, it is important that the total thickness of the conjoint layer be precisely controlled or measured after deposition, as the metallization layer to be applied will be substantially flush with a glass layer which will be applied in a later step. In place of the conjoint passivating layer 12/14 of oxide and nitride, a single layer of silicon nitride might be used. However, the nitride layer alone may not insure the requisite passivation for structures with extensive metallurgy.

The precise depth of the oxide and nitride coatings may be calculated by standard techniques. For example, the thicknesses may be measured by means of a technique described in "Non-Destructive Technique for Thickness and Refractive Index Measurements of Transparent Films," W. A. Pliskin and E. E. Conrad, IBM Techincal Disclosure Bulletin, Vol. 5, No. 10, March 1963, pp. 6–8. Preferrably, this technique is augmented with a spectrophotometer as described in "Transparent Thin-Film Measurements by Visible Spectrophotometry," A. Decobert and M. Lachaud, IBM Technical Disclosure Bulletin, Vol. 10, No. 11, April 1968, p. 1799. Besides this non-destructive method of testing the thickness of transparent thin films, any well-known destructive method using a test wafer could be used. One known destructive method is the so-called angle-lap technique. One end of the test wafer is beveled at a very small angle to expose a relatively broad surface of the layer to be measured. The beveled surface of the sample is stained or otherwise treated to delineate clearly the exposed surface of the layer. Monochromatic light is then directed through an optically flat glass plate onto the beveled surface. Light reflected from the beveled surface interfaces with light reflected from the glass plate to establish interface fringes along those locations of the beveled surface that are displaced from the flat glass plate by some multiple of a half wavelength of the light. These fringes can therefore be interpreted as being contour lines representing successive gradations of height on the beveled surface. The distance between each pair of fringes, called an order of interference, is representative of a vertical distance of one-half wavelength. An operator counts the number of fringes located along the beveled layer surface to be measured, and thereby estimates the total thickness of the layer.

In the modern manufacturing process, of course, there are other methods to determine and control the thickness of the coatings. For example, the process may be calibrated based on a test batch of wafers and the results used in succeeding batches with no further measurements being needed. In addition, it may be possible to monitor the deposition of the coatings during the process, eliminating the need for thickness measurements at the completion of the process.

Figure 2:
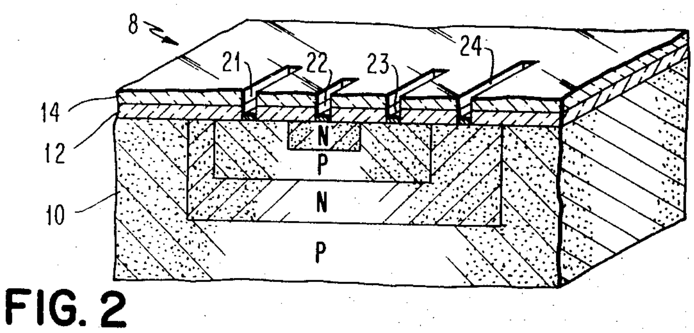
FIG. 2–5 show various stages of producing ohmic contacts and the first metallization level of active devices in accordance with the invention.
Figure 2A:
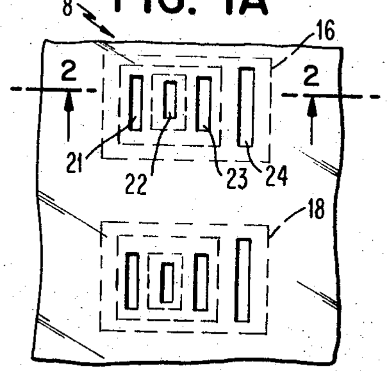
Figure 3:
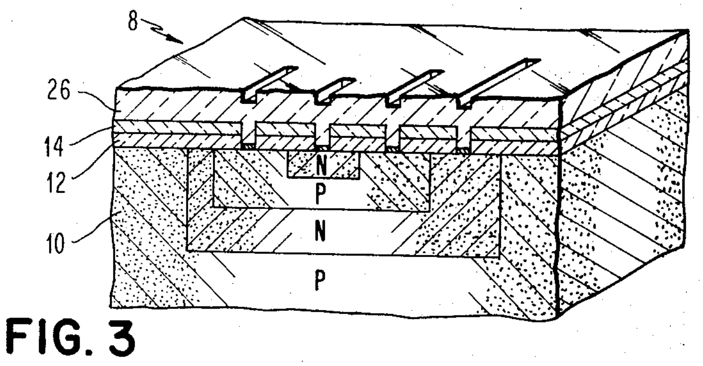

Referring now to FIG. 2, device 16 is shown after having received ohmic contacts at base regions 21 and 23, emitter region 22 and collector region 24. FIG. 2A is a top view of the wafer showing identical contacts having been formed in both devices 16 and 18. The openings for contacts 21–24 are formed by first providing a conventional photoresist mask corresponding to the openings. The silicon nitride coating 14 is then subjected to an etchant which in the present embodiment does not attack the oxide layer 12. Molten ammonium hypophosphate ($NH_4H_2PO_4$) is preferrable. Alternatively, hot phosphoric acid may be used. After the nitride is removed from the areas not masked, the silicon dioxide is removed from the same areas by a conventional buffer etchant which does not attack the nitride. A solution of hydrofluoric acid buffered in ammonium fluoride is suitable. This procedure exposes the surfaces of the active regions at 21, 22, 23, and 24. Ohmic contacts are then deposited, preferrably by applying a blanket layer of metal to the entire surface of the structure. A preferred metal is a 200A blanket of platinum which may be applied by sputtering. The platinum is then sintered at about 450° C. to form a platinum-silicide ohmic contact. The contact causes only a slight topology shift at surfaces 21–24, of around 40 A, most of the platinum diffusing into the active regions. This is too small to affect the desired substantially flush characteristic of the metallization to be applied in a later step and can be accurately estimated if necessary. Other metals, such as molybdenum or tungsten, may be used in lieu of platinum. In addition, this step might be dropped altogether, if desired. The ohmic contact might be formed at the same time as the later step of metallization. In the preferred embodiment of this invention, the blanket of platinum which covers the nitride surface 14 is then removed by a conventional subtractive etch process. Referring now to FIG. 3, a blanket glass layer 26 is shown deposited over the entire surface of the structure. Layer 26 is preferrably deposited using R.F. sputtering apparatus described in U.S. Pat. No. 3,369,991, P. D. Davidse et al. Other deposition methods may be used, such as silk screening or pyrolytic deposition. In any method the chemical composition of the glass is $SiO_2$. As with the conjoint coatings 12 and 14, the thickness of glass layer 26 must be accurately controlled or measured to insure that the quantity of metal deposited in a later step will be substantially flush with glass layer 26. The thickness of the glass is preferrably from 5000A to 20,000A. In the present embodiment it is 10,000A. The measurement of the glass depth may be determined or controlled in the same manner as previously described for the oxide and nitride coatings. It is evident that the measurement of the depth of conjoint passivating layer 12/14 could be performed after layer 26 has been formed.

Figure 4:
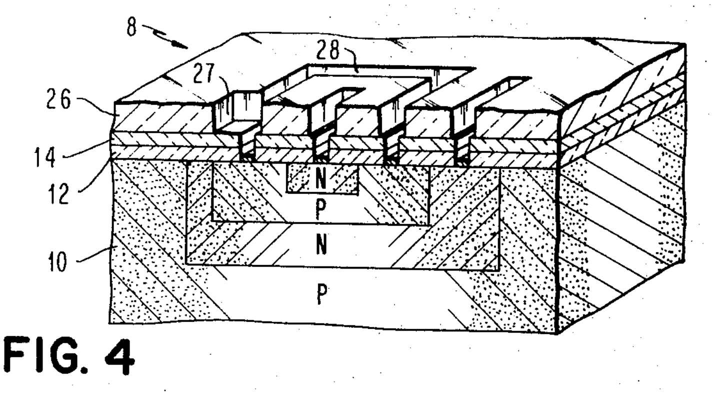
Figure 4A:
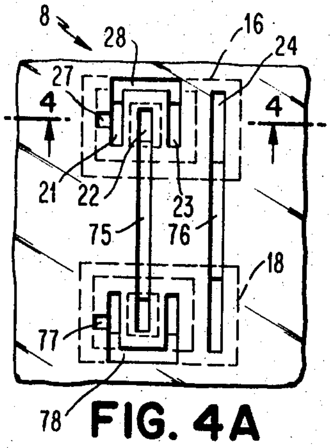

FIG. 4 is a sectional perspective view showing the ohmic contact regions 21–24 re-exposed. FIG. 4 also shows area 27 and trench 28 which have been formed by conventional techniques in glass layer 26, but which do not penetrate nitride layer 14. Area 27 is surrounded on three sides by glass layer 26 and is bottomed at nitride coating 14. Area 28 is a trench etched in glass layer 26 and is also bottomed at nitride coating 14. FIG. 4A is a top view of wafer 8 at this point in the process. FIG. 4A shows that areas 77 and 78, similar to area 27 and trench 28, have also been formed over device 18 and that trenches 75 and 76 have been formed in glass layer 26 to connect appropriate contacts of devices 16 and 18. Trenches 75 and 76 are also bottomed at nitride coating 14.

In forming the trenches and area 27, use is made of the fact that the glass etchant, which is preferrably the buffered hydrofluoric acid used previously to etch oxide coating 12, will not attack the nitride to any signifiant degree. In the etching process, a photoresist mask corresponding to openings 21–24, 27 and trench 28 is placed on the surface of glass 26. The surface of glass 26 is then exposed to a buffered etchant, as previously described, which does not attack the nitride coating 14. Nitride coating 14 protects the surface of oxide coating 12. The buffered etchant does not significantly attack oxide coating 12 which surrounds resigns 21–24.

Figure 5:
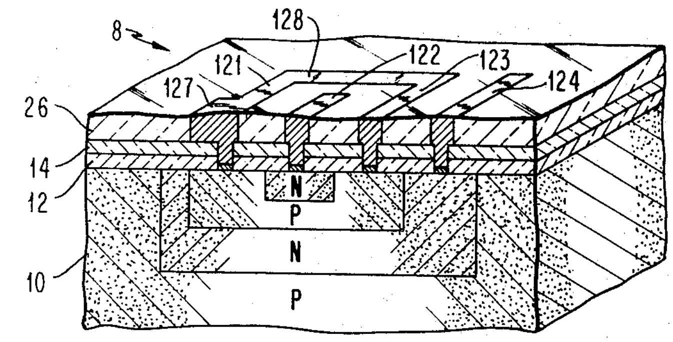

FIG. 5 shows the structure after metallization has been applied. The metal may be deposited by any suitable means such as evaporation, pyrolytic decomposition, or sputtering. The preferred metallization process is to mask the entire surface except contact regions 21–24. A first blanket layer of metal is now evaporated with a thickness equal to the depth of conjoint pasivating layer 12/14. This first mask is then replaced with a second mask which masks the entire surface except contact regions 21–24, area 27 and trench 28. A second blanket of metal is now evaporated with a thickness equal to or somewhat less than the depth of glass layer 26. In FIG. 5, the metallization in area 27 is denoted by the corresponding notation 127. Similar notation 121–124 and 128 is used for the metallization applied in areas 21–24 and trench 28, respectively. It will be apparent that other techniques might be used to apply the metallization. For example, a mask might be placed over only area 27 and trench 28. A first blanket of metallization might then be applied over the entire surface 26 and into the uncovered regions 21–24. The metallization on the surface would then be stripped off by a subtractive etch technique. A second blanket might then be applied over the entire surface, all openings being uncovered. The quantity applied in the second blanket would bring the level of metallization in the openings to be substantially flush with the glass layer 26. The metallization on the surface would then be stripped off by subtractive etching.

The amount of metal to be deposited may be calculated accurately prior to the evaporation process by calculating the volume of the openings and trenches in the passivating and insulating layers. Th surface area of the opening and trenches are precisely defined by the masks used to form them. This is well known. The depth of the passivating and insulating layers is calculated as previously described. In practice, however, the depth is the only key factor, because in either method of depositing the metallization, a uniform blanket will descend on the entire surface of the chip. As a result, all openings are filled uniformly with respect to the surface area. The depth of metal deposited may be controlled by conventional techniques. In the method of evaporation, a crystal oscillator oscillating at a known frequency is placed inside the evaporation chamber. As the metal is deposited on the wafers and the oscillator, the frequency change in the oscillator serves as a measure of the amount of metal deposited. For more details on this technique, see "Automatic Control of Film Deposition Rate with the Crystal Oscillator for the Preparation of Alloy Films," K. H. Behrndt and R. W. Love, *Vacuum Magazine*, Vol. 12, January–February, 1962, pp. 1–9. This technique is also explained in "Automatic Deposition Control," S. J. Lins and P. E. Oberg, *Electronics*, Mar. 29, 1963, pp. 33–35. In addition to this in-process method, the thickness of the metal may be determined after deposition by the standard technique of etching a step into the metal and, by interferometry, counting light fringes caused by a light source of known wavelength which illuminates the step. In this way the metallization in all areas is substantially flush with glass layer 26.

What has been described up to now may be considered to be an integral process to construct a final product; for example, simpler forms of transistor circuits require only a single metallization level to form interconnections between a number of circuits on a single chip. Power connections and connections external to the chip could be made on the same level according to the principles of this invention. It is desirable to form another protective layer on top of the chip such as glass or quartz. The important feature is the fact that the surface of metallization 28 is substantially flush or planar with oxide layer 26. However, the real benefit of this invention arises in multilayer devices. As already described, the present methods of forming metallization and insulating layers have a tendency to cause pinholes. It is in correcting the pinhole problem in multilevels of metallization that the invention is most applicable.

Figure 6:
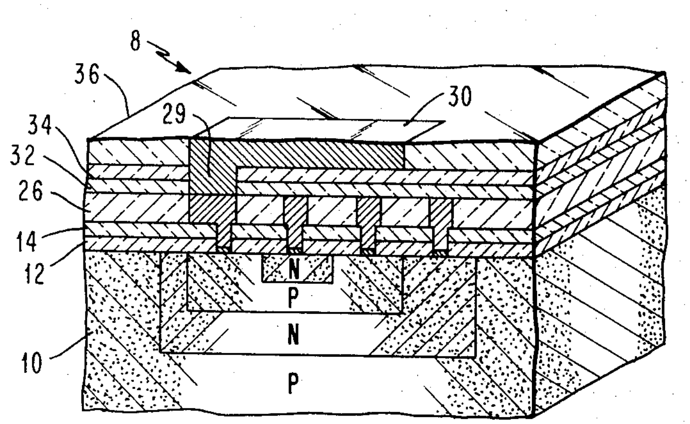
FIGS. 6 and 7 show an active device with second and third levels of metallization, respectively, in accordance with the invention.
Figure 6A:
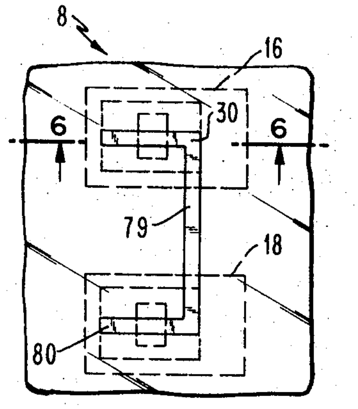
FIGS. 6A and 7A are views of the top surface of the chip showing the metallization patterns connecting the active devices.

FIG. 6 shows an active device with two levels of metallization. The stages of manufacture of the second level are quite similar to the first. Silicon oxide coating 32 and silicon nitride coating 34 are applied in the same way as oxide coating 12 and nitride coating 14, as previously described and shown in FIG. 1. It may be desirable to omit the deposition of coating 32 altogether and apply nitride coating 34 directly on glass layer 26. This would eliminate one process step. However, to assure the highest yield possible in high performance circuits, coating 32 will usually be applied. An opening, commonly termed a via hole, using the same etching and photoresist techniques as used to form openings in conjoint layer 12/14 is then formed in conjoint passivating layer 32/34. This opening is formed over metallization 127 and over a portion of metallization 121, the deposition of which has previously been described and shown in FIG. 5. Glass insulating layer 36 is then deposited in the same way as was glass layer 26 previously described and shown in FIG. 3. Initially, layer 36 completely covers coating 34 and overlies metallization 127 and 121 through the via hole in conjoint layer 32/34. The via hole over metallization 127 and 121 is then re-exposed and a trench is also etched in glass layer 36, preferrably simlutaneously. The trench is bottomed on nitride layer 34, again using the property that the buffered hydrofluoric acid etchant does not significantly attack nitride layer 34. At this point, the depth of passivating layer 32/34 and of insulating layer 36 is determined or controlled by the procedures already discussed. Metal 29 and metallization 30 is then deposited, filling the via hole and trench substantially flush with glass layer 36. Conductive contact is thus made by metal 29 between selected portions of the first and second metallization levels. FIG. 6A is a top view of the second metallization pattern showing metallization 30 over device area 16, corresponding metallization 80 over device area 18 and metallization 79 which connects the two. Each of these metallization lands are bottomed on nitride layer 34.

It will be recognized by those of skill in the art that the thickness of coatings 32 and 34 and layer 36 need not be the same as the thickness of corresponding coatings 12 and 14 and layer 26. In practice, the second level of metallization is usually thicker than the first level due to electrical design parameters. In the present embodiment, however, the thicknesses are the same.

Figure 7:
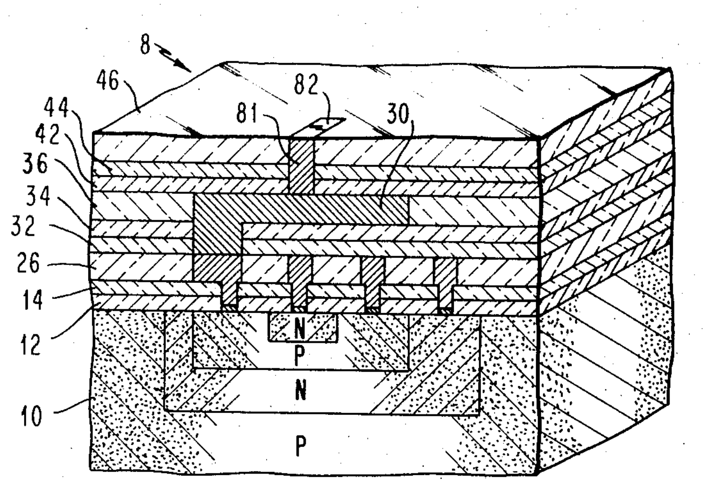
Figure 7A:
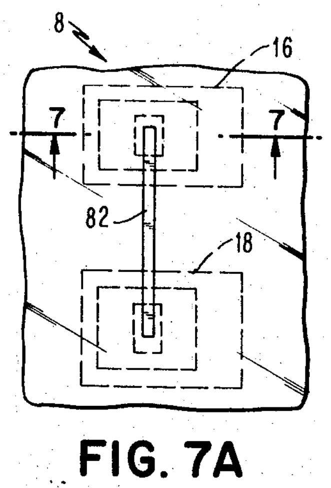

In FIG. 7, a third metallization level is shown which, for example, may be connected to a power bus or other terminal on the chip itself or on the ceramic substrate not shown. Silicon oxide coating 42 and silicon nitride coating 44 are formed in the same way as oxide coating 32 and nitride coating 34. As previously explained with respect to oxide coating 32, it may be desirable to omit the depositing of oxide coating 42 althgether and apply nitride coating 44 on glass layer 36. However, coating 42 will usually be applied. A via hole is formed in conjoint passivating layer 42/44 over a selected portion of metallization 30. Glass insulation layer 46 is then deposited in the same way as previously described for layers 26 and 36. Layer 46 completely covers coating 44 and overlies the selected portion of metallization 30 which is exposed through the via hole in conjoint layer 32/34. The via hole is then re-exposed and a trench is etched in glass layer 46 and bottomed on nitride coating 44. The re-opening of the via hole and the formation of the trench are preferrably done simultaneously by the same etchant. The trench is bottomed on nitride layer 44 because the buffered hydrofluoric acid etchant does not significantly attack nitride layer 44. The depth of passivating layer 42/44 and of insulating layer 46 may be determined or controlled by the methods already discussed. Metallization 82 is then deposited substantially flush with glass layer 46. Conductive contact is made by means of metal 81 between selected portions of the metallization 30 and 82. If desired, a quartz layer may be deposited on top of glass layer 46 and the third metallization level for protective purposes. For reasons of power requirements, the total depth of metal 81 and metallization 82 is preferrably 20,000A.

Briefly stated, this invention has eliminated one source of failure in semiconductor circuits by eliminating the humps of metallization common to prior art structures. The method described is highly accurate because it uses two materials which are mutually insensitive to etchants which will attack the other. One material, in this case silicon nitride, comprises the bottom of a trench which is surrounded by the other material, in this case silicon dioxide (glass). The height of the trench can thus be accurately estimated and controlled. The length and width of the trench are also accurately defined by the prior art masking techniques. This allows the deposition of a precise volume of metal into the trench and substantially flush with the top of the trench.

Using prior art methods, it would be possible to have humps caused by the metallization of over 30,000A in height. These discontinuities in the smooth surface of the insulating layers cause the failure mechanism already described. It will be apparent that this method achieves greater effectiveness as the metallization becomes bulkier and more complex, a highly desirable characteristic.

While the invention has been particularly shown and described with reference to a preferred embodiment thereof, it will be understood by those skilled in the art that various changes in form and detail may be made therein without departing from the spirit and scope of the invention. For instance, as many levels of metallization as desired could be fabricated using this method. In addition, more complex metallization patterns in each level might be designed. Conductive connections between lands could be more numerous; conversely, conductive connections need not always be made between one metallization level and the next succeeding metallization level as shown in the present embodiment. Moreover, the trenches might be etched in the nitride coating, the bottom of the trench being an oxide or glass coating.

What is claimed is:

1. A semiconductor structure comprising:

a semiconductor body containing at least one active area;

at least one P-N junction at a surface of the body and formed within the active areas;

a plurality of superposed sections formed over the surface of the semiconductor body in laminated fashion, the first section being disposed on the surface of the body, each section comprising:

a passivating layer having a thickness less than 10,000A;

an insulating layer on the surface of the passivating layer, the insulating layer having a thickness ranging between 5,000A and 20,000A and having at least one trench formed therein, the upper surface of the passivating layer being the bottom of the trenches;

said passivating layer having the property of being insensitive to an etchant to which the insulating layer is sensitive, metallization filling the trenches, the surface of the metallization being substantially flush with the surface of the insulating layer;

at least one conductive contact formed between the P-N junctions and the metallization in the first section;

at least one conductive contact formed between the metallization in one section and the metallization in another section.

2. A semiconductor structure as in claim 1 wherein the passivating layer is silicon nitride having a thickness less than 2,000A and the insulating layer is glass.

3. A semiconductor structure as in claim 1 wherein the passivating layer is comprised of conjoint coatings of silicon oxide having a thickness ranging between 2,000A and 8,000A and silicon nitride having a thickness less than 2,000A.

4. A semiconductor structure as in claim 1 wherein the passivating layer of the first section is comprised of conjoint coatings of silicon oxide and silicon nitride and the passivating layer of the remaining superposed sections is silicon nitride.

5. A semiconductor structure as in claim 1 wherein conductive contact is formed between selected portions of the metallization in adjacent sections.

* * * * *

PO-1050
(5/69)

UNITED STATES PATENT OFFICE
CERTIFICATE OF CORRECTION

Patent No. 3,838,442 Dated September 24, 1974

Inventor(s) C. B. Humphreys

It is certified that error appears in the above-identified patent and that said Letters Patent are hereby corrected as shown below:

Column 4, Line 20 (In the Application, Page 7, Line 28) — change "600a" to -- 6000A --

Column 6, Line 42 (In the Application, Page 12, Line 22) — change "resigns" to -- regions --

Column 7, Line 9 (In the Application, Page 13, Line 22) — change "Th" to -- The --

Column 7, Line 10 (In the Application, Page 13, Line 22) — change "opening" to -- openings --

Signed and sealed this 17th day of December 1974.

(SEAL)
Attest:

McCOY M. GIBSON JR.
Attesting Officer

C. MARSHALL DANN
Commissioner of Patents